United States Patent
Chou et al.

(10) Patent No.: US 8,779,551 B2
(45) Date of Patent: Jul. 15, 2014

(54) GATED DIODE STRUCTURE FOR ELIMINATING RIE DAMAGE FROM CAP REMOVAL

(75) Inventors: Anthony I. Chou, Beacon, NY (US); Arvind Kumar, Beacon, NY (US); Edward P. Maciejewski, Wappingers Falls, NY (US); Shreesh Narasimha, Beacon, NY (US); Dustin K. Slisher, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/489,537

(22) Filed: Jun. 6, 2012

(65) Prior Publication Data

US 2013/0328124 A1    Dec. 12, 2013

(51) Int. Cl.
*H01L 27/06* (2006.01)

(52) U.S. Cl.
USPC .................................. 257/577; 257/E29.195

(58) Field of Classification Search
USPC .......................................... 257/577, E29.195
See application file for complete search history.

(56) References Cited

U.S. PATENT DOCUMENTS

| | | | |
|---|---|---|---|
| 5,262,344 A | 11/1993 | Mistry | |
| 5,589,423 A | 12/1996 | White et al. | |
| 5,920,774 A * | 7/1999 | Wu | 438/224 |
| 5,998,247 A | 12/1999 | Wu | |
| 6,259,140 B1 | 7/2001 | Liu et al. | |
| 6,492,234 B1 | 12/2002 | Moroni et al. | |
| 6,831,334 B2 * | 12/2004 | Okawa et al. | 257/356 |
| 6,855,586 B2 * | 2/2005 | Walker et al. | 438/174 |
| 6,861,369 B2 | 3/2005 | Park | |
| 6,929,992 B1 * | 8/2005 | Djomehri et al. | 438/199 |
| 7,122,472 B2 * | 10/2006 | Fang et al. | 438/664 |
| 7,229,871 B2 * | 6/2007 | Yu et al. | 438/199 |
| 7,476,973 B2 | 1/2009 | Kim | |
| 7,579,227 B2 * | 8/2009 | Hirase et al. | 438/197 |
| 7,602,031 B2 * | 10/2009 | Kim | 257/413 |
| 7,977,194 B2 * | 7/2011 | Fukutome et al. | 438/275 |
| 8,232,603 B2 * | 7/2012 | Chou et al. | 257/368 |

(Continued)

FOREIGN PATENT DOCUMENTS

| | | |
|---|---|---|
| KR | 10-2004-0007949 | 1/2004 |
| KR | 10-2005-0054026 | 6/2005 |
| KR | 10-2009-0007121 | 1/2009 |

OTHER PUBLICATIONS

International Search Report/Written Opinion; PCT/US2013/043963; Aug. 27, 2013.

*Primary Examiner* — Eugene Lee
(74) *Attorney, Agent, or Firm* — H. Daniel Schnurmann

(57) ABSTRACT

A semiconductor structure provided with a plurality of gated-diodes having a silicided anode (p-doped region) and cathode (n-doped region) and a high-K gate stack made of non-silicided gate material, the gated-diodes being adjacent to FETs, each of which having a silicided source, a silicided drain and a silicided HiK gate stack. The semiconductor structure eliminates a cap removal RIE in a gate first High-K metal gate flow from the region of the gated-diode. The lack of silicide and the presence of a nitride barrier on the gate of the diode are preferably made during the gate first process flow. The absence of the cap removal RIE is beneficial in that diffusions of the diode are not subjected to the cap removal RIE, which avoids damage and allows retaining its highly ideal junction characteristics.

10 Claims, 11 Drawing Sheets

(56) References Cited

U.S. PATENT DOCUMENTS

| | | |
|---|---|---|
| 2008/0237666 A1 | 10/2008 | Kido et al. |
| 2008/0280403 A1 | 11/2008 | Chittipeddi et al. |
| 2009/0159973 A1 | 6/2009 | Hiraoka et al. |
| 2011/0042753 A1 | 2/2011 | Jain et al. |
| 2011/0108926 A1* | 5/2011 | Bahl .......................... 257/379 |

* cited by examiner

GATED DIODE STRUCTURE FOR ELIMINATING RIE DAMAGE FROM CAP REMOVAL

FIELD OF THE INVENTION

The present invention relates to semiconductor devices, and more particularly, to gated-diodes that includes capping dielectric layers within the active semiconductor structures.

BACKGROUND AND RELATED ART

Semiconductor diodes, in particular gated-diodes, are often used in CMOS integrated circuits for important analog circuit functions including temperature sensing and bandgap reference voltage applications. For the analog applications to properly function, the forward-bias diode characteristics should be nearly ideal, as measured by the diode ideality factor (n) which should be nearly equal to a value of 1. In advanced CMOS technologies, achieving a gated-diode structure with good ideality near 1 can be challenging because of the widespread use of Reactive Ion Etching (RIE), which can damage then semiconductor structures. RIE related damage is known to degrade diode ideality. Thus, in order to achieve a good diode ideality, the RIE damage should be eliminated or minimized.

Diodes in general are formed by creating abutting semiconducting regions of N-doped (excess electrons) and P-doped (excess holes). Preferably, one but not both regions is more heavily doped, creating either an N+/P diode or a P+/N diode. N-doped regions are typically formed by implanting or diffusing N-type donor dopant species, such as arsenic or phosphorus, into the semiconductor material such as silicon. Similarly, P-doped regions are formed by implanting or diffusing P-type acceptor dopant species, e.g., boron into a region adjacent to and contacting the N-type region. Typically, a dopant activation thermal cycle or heating is necessary to make the dopants electrically active.

Gated-diodes formed as described, with the addition of a gate electrode and gate dielectric located at or near the location of the P-N junction. Often but not always, the gate electrode serves as a masking structure to allow creating a self-aligned P-N diode wherein the edge of the gate electrode defines the location of the P-N junction. Self-alignment can be achieved when the P-N junction is formed by ion implantation, and the gate electrode is sufficiently thick to block either the heavier P+ or N+ region implant from penetrating through to the underlying semiconductor substrate, and is wide enough laterally to allow a photolithography mask to consistently land on the gate even in the presence of loose manufacturing alignment tolerances. Generally, it can be advantageous to achieve good diode ideality by locating the P-N junction underneath the gate electrode and gate dielectric because this region is typically a high quality interface largely free of defects. Avoiding defects in and around the P-N junction region is important for achieving good ideality, as defects are known to create generation and/or recombination sites which degrade the diode ideality.

Dielectric capping layers (such as nitride or oxide) on top of gates are commonly used in CMOS fabrication. Examples of the uses for these dielectric capping layers include use as a hard mask for gate electrode patterning and increasing the gate stack thickness for ion implantation blocking effectiveness. A gate electrode hard mask is a layer or layers patterned on top of a blanket gate electrode, which protects desired regions from RIE, thus forming patterned gate electrodes. This is in contrast to soft mask based patterning where the pattern is formed using photoresist. Oftentimes it is beneficial to keep the dielectric hard mask on top of the gate even after the gate electrode etching has been completed and during subsequent ion implantation steps required for building the gated-diode and Field Effect Transistors (FET). The additional dielectric layer contributes to blocking ion implantations, such as source/drain or halo implants from penetrating through the gate electrode into the channel. The dielectric layer is typically removed by RIE prior to a silicide formation, to enable the gate electrode region to be silicided. However, RIE can damage and introducing defects within and nearby the gated diode (P-N junction) region, resulting in a degraded ideality, that ultimately leads to poor circuit functionality in temperature sensor, bandgap reference voltage and other analog circuits that rely on good diode ideality.

Generally, all the gates and diffusions of a sub 250 nm technology have silicide formed to minimize resistance, knowing that silicidation of silicon and polysilicon regions reduces the resistance which results in increased transistor and circuit performance.

FIG. 1 is a perspective view of a prior art structure for a diode and a FET as part of integrated circuit. For simplicity, a single N-FET is shown, but it should be understood that N-FETs and P-FETs can be used together as part of CMOS integrated circuits. The fabrication sequence for the conventional structure shown in FIG. 1 results in damage to the diode which degrades the diode ideality. Note that in this prior art structure and P+/N diode is shown, but it should be understood that an N+/P diode can also be used.

Accordingly, there is a need for a structure that provides the benefits of a dielectric capping layer on top of the gate electrode of the gated-diode to avoid the diode ideality degradation of removing the capping layer that is desired for advanced CMOS integrated circuits.

SUMMARY

In one aspect, an embodiment of the invention provides a chip having an FET with a silicided high-K gate stack, source, and drain on high performance devices, with an adjoining diode having a silicided cathode and anode regions and a non-silicided high-K gate stack structure, the use of silicide implying a gate first high-K metal gate process with polysilicon in the stack.

In another aspect, an embodiment provides a polysilicon gate of the gated-diode that does not require silicidation as a gate terminal which is not intended to carry a significant current if the gate dielectric is sufficiently thick, such that the higher resistance of the non-silicided polysilicon is not a concern. The polysilicon gate of the gated-diode separates the cathode and anode implants, blocking the silicide between the anode and cathode. Because the gate electrode of the gated-diode does not require siliciding, it avoids the need to remove the cap from the gate over the device. By protecting the gated-diode with resist during a cap removal etching process, damage to the gated-diode due to etching can be avoided in view of etching a gate capping layer creates recess and damage in silicon regions near the diode P-N junction that degrades the diode ideality. By avoiding damage, an excellent diode ideality can be achieved. With the cap layer in place on top of the gate, silicide is not formed on the gate, but as described previously, the gate terminal of a gated-diode does not need to carry significant current. Hence, a higher resistance of non-silicided gate terminal is not a concern.

In yet another aspect, a semiconductor structure is provided with a silicided high-K gate stack, source, and drain on high performance NFETs/PFETs and a gated-diode having a silicided anode and cathode regions and non-silicide HiK gate stack structure, the use of a silicide on the high-K gate stack of the FET implying a gate-first high-K metal gate process with polysilicon in the stack.

In still another aspect, a semiconductor integrated circuit is provided with an n-FET and/or a p-FET having a silicided gate, source, drain, and a gated-diode with silicided anode and cathode regions, and a non-silicided gate. The NFETs/PFETs, gated-diodes and other active or passive devices are connected to metal wiring to form an integrated circuit.

In a further aspect, an embodiment provides a semiconductor structure on a substrate that includes an FET having a silicided source, a silicided drain and a silicided gate stack; and a gated-diode adjacent to the FET having a silicided anode, a silicided cathode and a non-silicided gate stack, the non-silicided stack having a top surface covered by a layer of a material that inhibits silicide formation.

In still another aspect, an embodiment provides a method of forming a semiconductor structure that includes forming on a semiconductor substrate an FET having a silicided source, a silicided drain and a silicided gate stack; and forming a gated-diode adjacent to the FET having a silicided anode, a silicided cathode and a non-silicided gate stack, the non-silicided gate stack having a top surface covered by a layer of material that inhibits silicide formation.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of embodiments of the invention, wherein like reference numerals denote like elements and parts, in which.

DETAILED DESCRIPTION

Figures 1, 2:
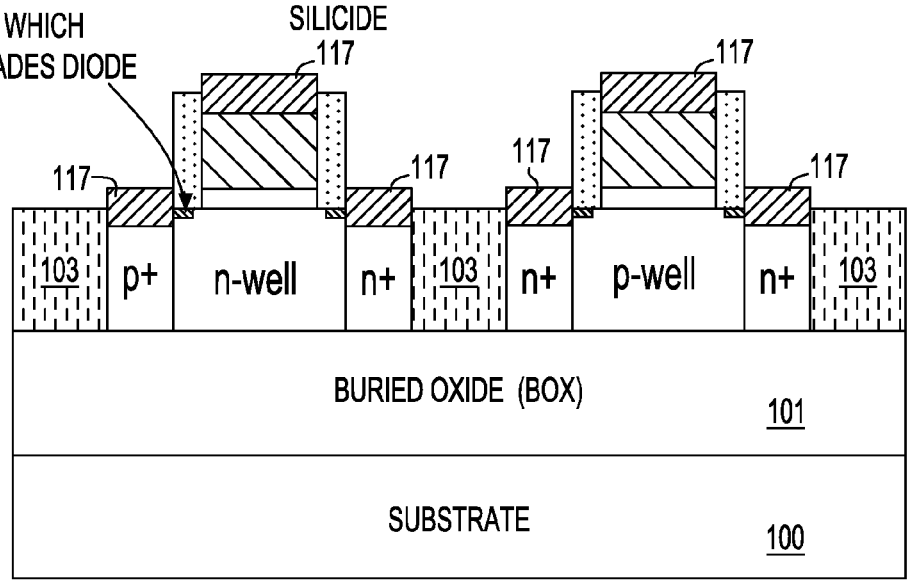
FIG. 1 shows a perspective view of a prior art diode and an FET as part of integrated circuit illustrating the damage to the diode degrading the diode ideality.
FIG. 2 illustrates a perspective view of the SOI substrate of FIG. 1 following superimposing over a silicon substrate a buried oxide layer (BOX) followed by the SOI layer.

Detailed embodiments of the methods and structures of the present disclosure are described herein; however, it is to be understood that the disclosed embodiments are merely illustrative of the described methods and structures that can be embodied in various forms. In addition, each of the examples given in connection with the various embodiments of the disclosure is intended to be illustrative, and not restrictive. Further, the figures are not necessarily to scale, some features can be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "top", "bottom", and derivatives thereof shall relate to the disclosed structures, as they are oriented in the drawings.

Referring to FIG. 2, an illustrative structure and a method for forming semiconductor FET devices on a semiconductor-on-insulator (SOI) substrate are described.

FIG. 2 shows a substrate [100], presently Silicon-on-Insulator (SOI). The SOI layer [102] is located above the buried-oxide layer (BOX) [101] and the substrate [100]. The buried oxide (BOX) layer [101] on the substrate [100] can be made as a silicon oxide, a nitride, a silicon nitride, and/or an oxynitride, e.g., silicon oxynitride, having a thickness ranging from 5 nm to 1000 nm, or preferably, from 10 nm to 200 nm, and still more preferably, from 10 nm to 25 nm.

The semiconductor-on-insulator (SOI) substrate can be employed as the semiconductor substrate. When employed, the SOI substrate includes a handle substrate superimposed by a buried insulator layer located on an upper surface of the handle substrate, and a semiconductor device layer located on an upper surface of the buried insulator layer. The handle substrate and the semiconductor device layer of the SOI substrate can include the same or different semiconductor material. The term "semiconductor" as used herein in connection with the semiconductor material of the handle substrate and the semiconductor device layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate and a semiconductor device layer [102]. In one embodiment, the handle substrate [100] and the semiconductor device layer are both made of Si.

The handle substrate and the semiconductor device layer can have the same or different crystal orientation. For example, the crystal orientation of the handle substrate and/or the semiconductor device layer can be {100}, {110}, or {111}. Other crystallographic orientations besides those specifically mentioned can also be used in the present disclosure. The handle substrate of the SOI substrate can be a single crystalline semiconductor material, a polycrystalline material, or an amorphous material. The semiconductor device layer of the SOI substrate is a single crystalline semiconductor material. A single crystalline semiconductor material (or monocrystalline semiconductor material) is a semiconductor material in which the crystal lattice of the entire sample is continuous and unbroken to the edges of the sample, with no grain boundaries.

The buried insulator layer of the SOI substrate can be a crystalline or non-crystalline oxide or nitride. In one embodiment, the buried insulator layer is made of oxide. The buried insulator layer 101 can be continuous or it can be discontinuous. When a discontinuous buried insulator region is present, the buried insulator region exists as an isolated island that is surrounded by semiconductor material.

The SOI substrate can be formed utilizing standard processes including for example, SIMOX (separation by ion implantation of oxygen) or layer transfer. When a layer transfer process is employed, an optional thinning step can follow the bonding of two semiconductor wafers together. The optional thinning step reduces the thickness of the semiconductor layer to a layer having a thickness that is more desirable.

The thickness of the semiconductor device layer of the SOI substrate is typically from 100 Å to 1000 Å, with a thickness from 500 Å to 700 Å being more typical. In some embodiments, and when an ETSOI (extremely thin semiconductor-on-insulator) substrate is employed, the semiconductor device layer of the SOI has a thickness of less than 100 Å. If the thickness of the semiconductor device layer is not within one of the above mentioned ranges, a thinning step such as, for example, planarization or etching can be used to reduce the thickness of the semiconductor device layer to a value within one of the ranges mentioned above.

Figure 3:
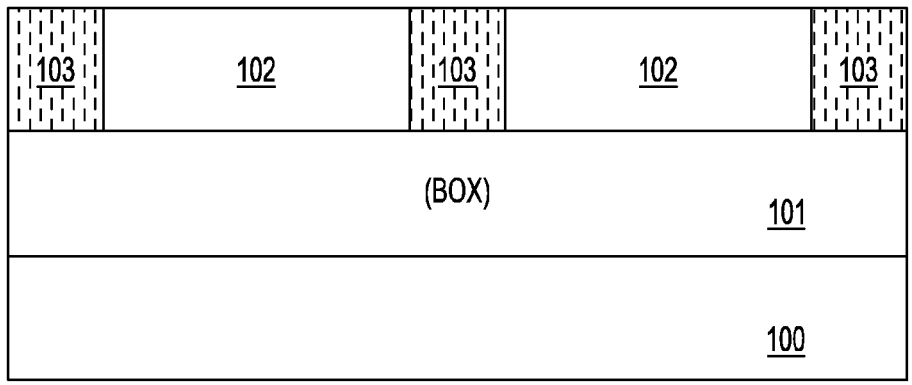
FIG. 3 depicts a perspective view of the structure illustrated in FIG. 2 wherein a shallow trench isolation (STI) is formed in the SOI layer isolating the n-well from the p-well, followed by planarization such as CMP.

Referring to FIG. 3, a shallow trench isolation (STI) [103] created by a fabrication sequence is shown including trench etching, dielectric deposition such as oxide, followed by planarization such as CMP. The isolation formed by the STI process includes patterning (e.g., deposition a sacrificial pad layer (e.g., pad oxide and pad nitride), patterning (e.g., by lithography) and etching STI trenches, preferably by reactive ion etch (RIE), filling the trenches with one or multiple insulators including but not limited to oxide, nitride, oxynitride, high-k dielectric, or any suitable combination of those materials. The planarization process, such as chemical-mechanical polishing (CMP), can be used to provide a planar structure. Besides STI [103] other isolation such as mesa isolation, local oxidation of silicon (LOCOS) can also be used. The sacrificial pad oxide and pad nitride can then be stripped.

Figure 4:
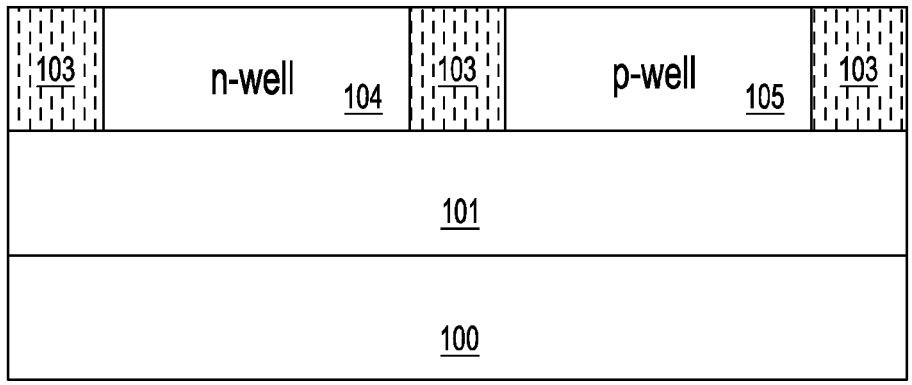
FIG. 4 shows ion implantation into different regions to form n-well and p-well regions.

FIG. 4 shows ion implantation into different regions to form n-well [104] and p-well [105] regions. The n-well ion implantation can be n-type dopant elements including arsenic or phosphorus. The p-well ion implantation preferably uses a p-type dopant material, including boron or indium.

Figure 5:
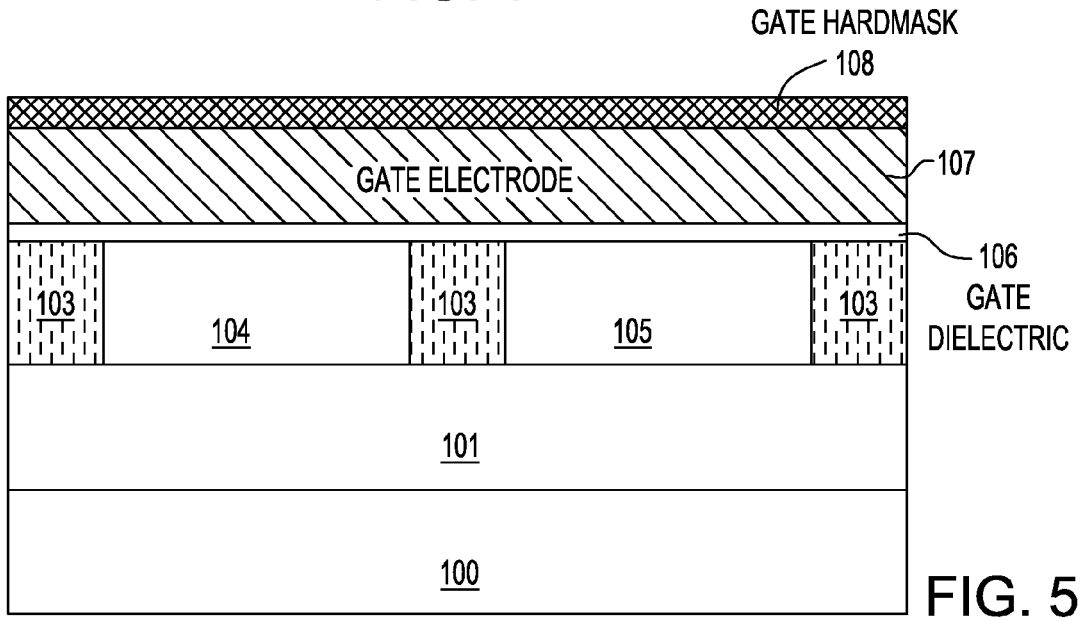
FIG. 5 shows a perspective view of the formation of the gate stack that includes a gate dielectric, a gate electrode, and a hardmask.

Referring to FIG. 5, forming a gate stack is illustrated including a gate dielectric [106], a gate electrode [107], and a hardmask [108]. The gate dielectric [106] can be selected from silicon oxide, silicon oxynitride, nitride, high-K materials such as hafnium oxide or stacked combinations thereof. Gate electrode [107] is a conductor or semiconductor, e.g., polysilicon or metal, e.g., TiN, or stacked combinations thereof. The polysilicon layer can be doped by way of ion implantation or in-situ doped during the deposition. The hardmask [108] is typically a dielectric, e.g., silicon oxide, silicon nitride or a stacked combination thereof.

Figure 6:
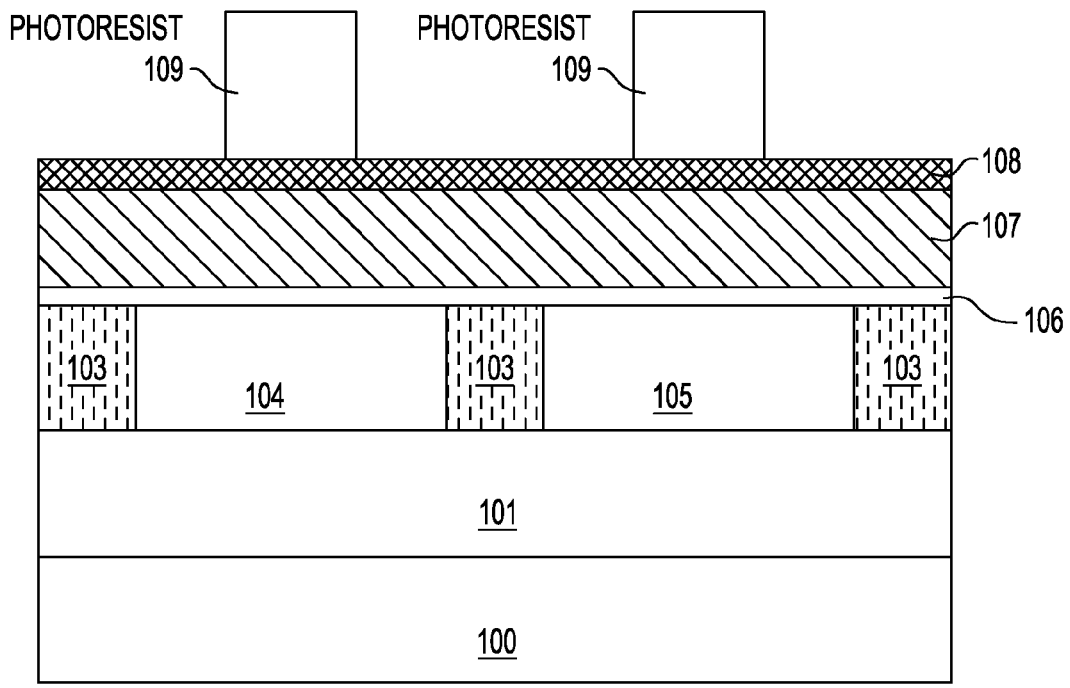
FIG. 6 shows gate patterning using a photoresist.

Referring to FIG. 6, gate patterning is shown preferably using photoresist, a mask exposure using optical source, and photoresist development leaving the photoresist in desired areas [109].

Figure 7:
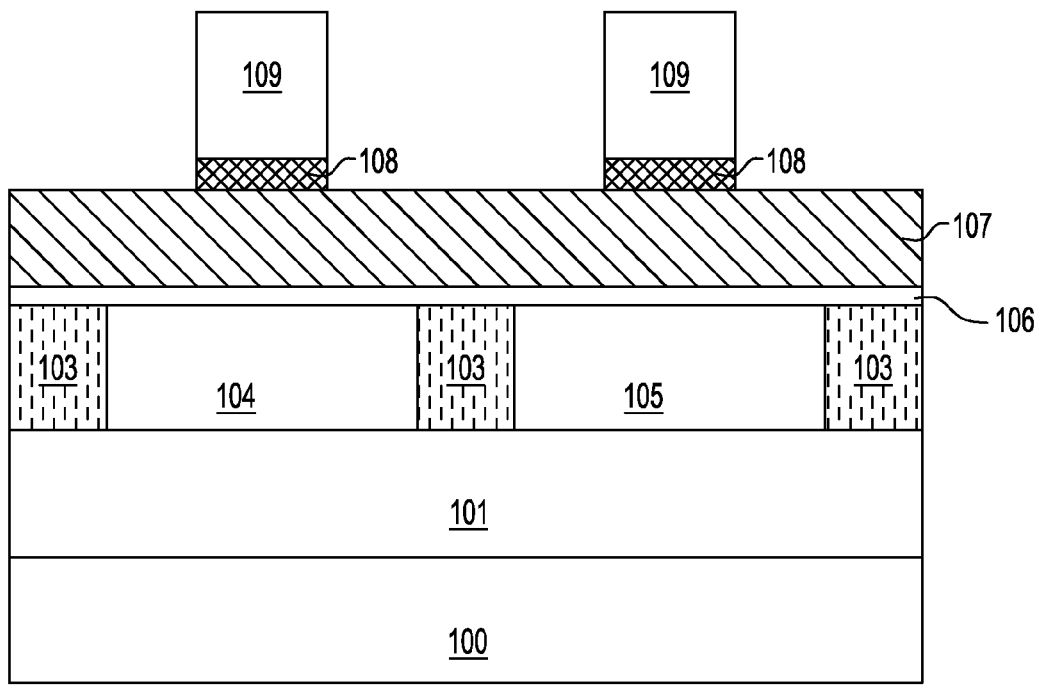
FIG. 7 illustrates the resulting structure after etching the hardmask, transferring the photoresist pattern.

FIG. 7 shows the resulting structure after etching the hardmask, preferably using a RIE process, and transferring the photoresist pattern into the hardmask.

Figure 8:
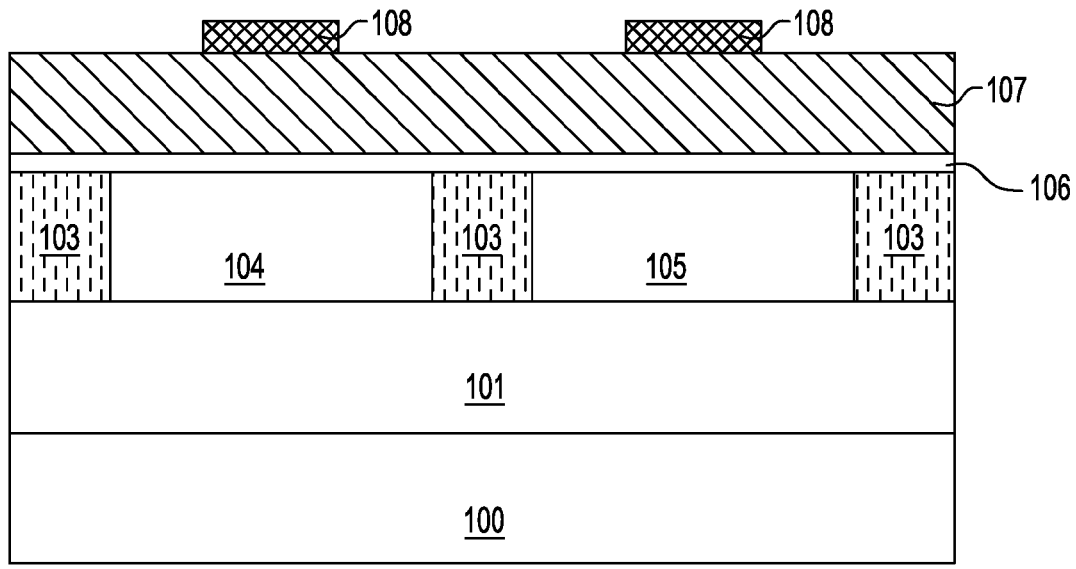
FIG. 8 is a perspective view of the structure after removing the photoresist, leaving the etched hardmask in the desired pattern.

Referring to FIG. 8, the structure is shown following the removal of the photoresist by way of a stripping process, leaving the etched hardmask in the desired pattern.

Figure 9:
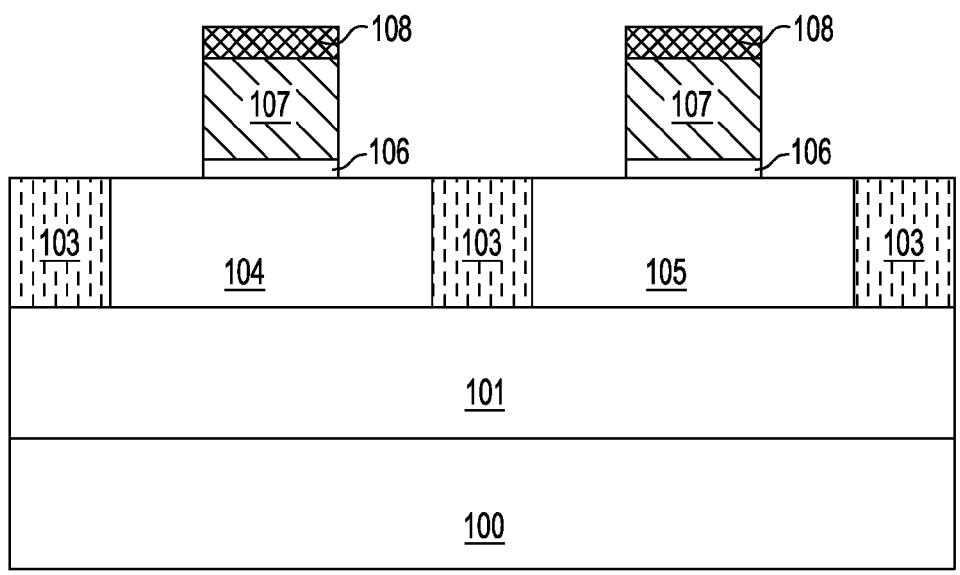
FIG. 9 shows the structure after etching the gate electrode and gate dielectric forming gates in the desired pattern.

FIG. 9 shows the structure after etching the gate electrode [107] and gate dielectric [106], preferably using a directional RIE, forming gates in the desired pattern.

Figure 10:
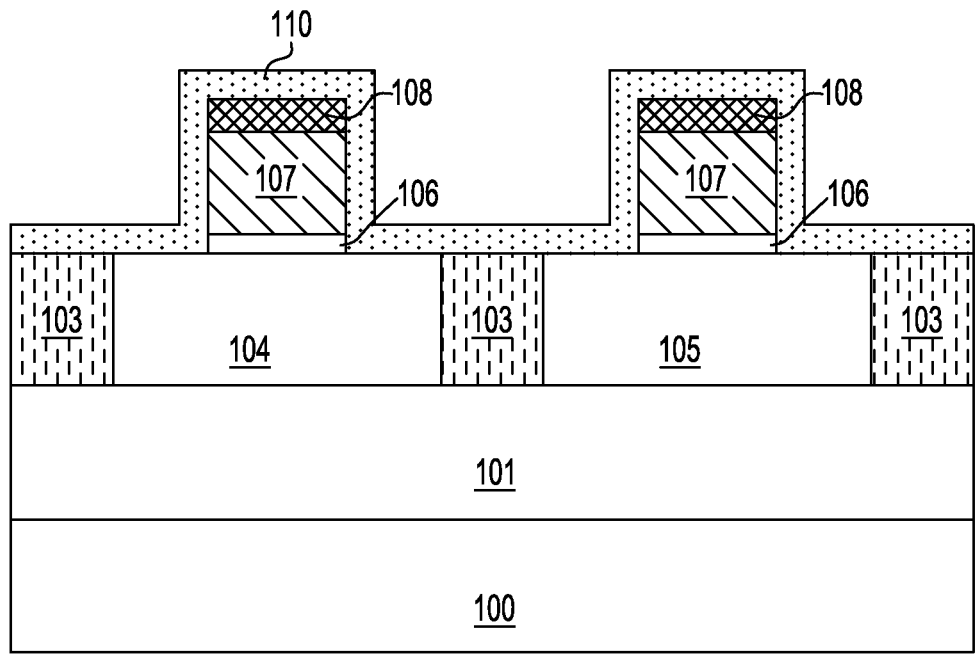
FIG. 10 shows the structure after a conformal spacer material is deposited.

FIG. 10 shows the structure following the deposition of a conformal spacer layer [110]. The spacer material is preferably a dielectric such as silicon nitride or silicon oxide that can be deposited by way of Chemical Vapor Deposition (CVD), Atomic Layer Deposition (ALD) or Molecular Layer Deposition (MLD).

Figure 11:
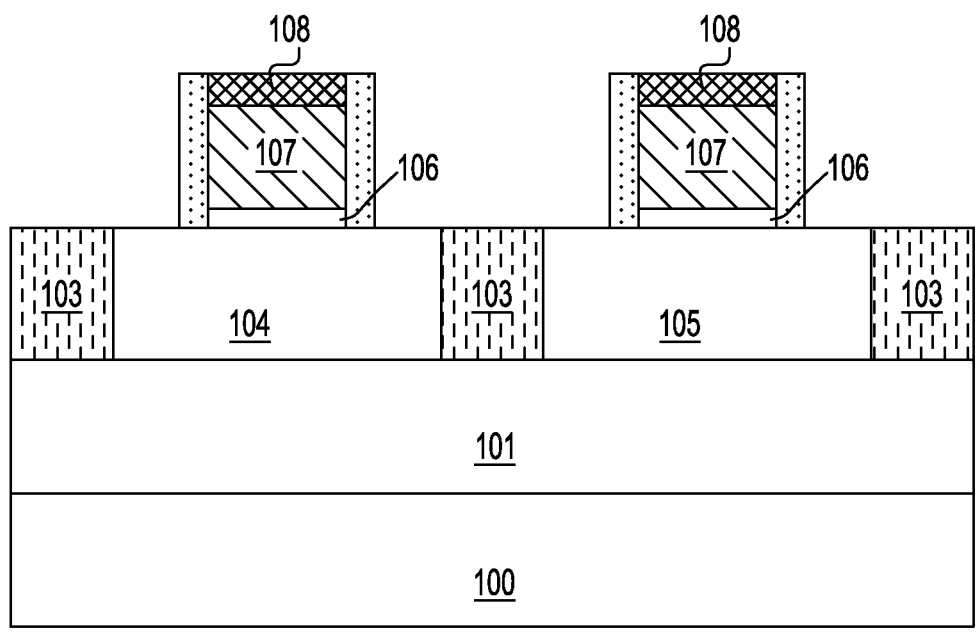
FIG. 11 shows the resulting structure after etching the spacer material, preferably by a directional Reactive Ion Etch (RIE) process that removes the spacer material from the horizontal surfaces while leaving it on the vertical sidewalls.

FIG. 11 illustrates the resulting structure after etching the spacer material, preferably using a directional Reactive Ion Etch (RIE) tot remove the spacer material from the horizontal surfaces but keeping it on the vertical sidewalls.

Figure 12:
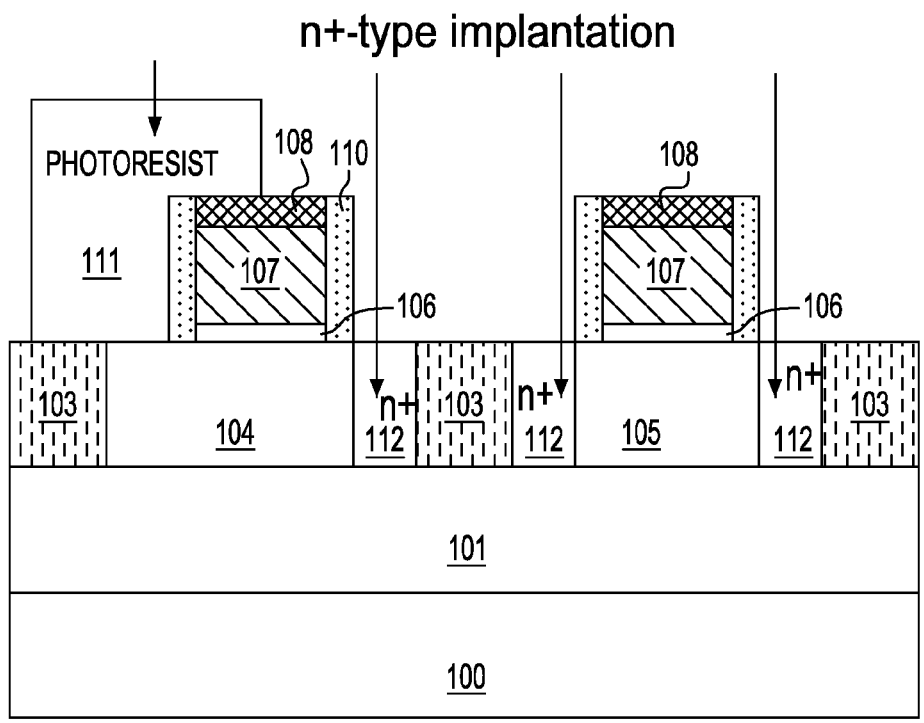
FIG. 12 illustrates opening areas by way of the photoresist masking to receive N+ doping by ion implantation, the N+ region serving as source drain regions of an NFET or the N-well contact of the diode.

FIG. 12 shows a photoresist masking [111] that opens areas that are to receive N+ doping by ion implantation [112]. N-dopant materials preferably include arsenic or phosphorus. The N+ region serves as the source drain region of an NFET or as the N-well contact of the diode. Alternatively, the N+ region could be formed by etching a trench and filling it with epitaxially deposited semiconductor, such as N-doped SiC.

Figure 13:
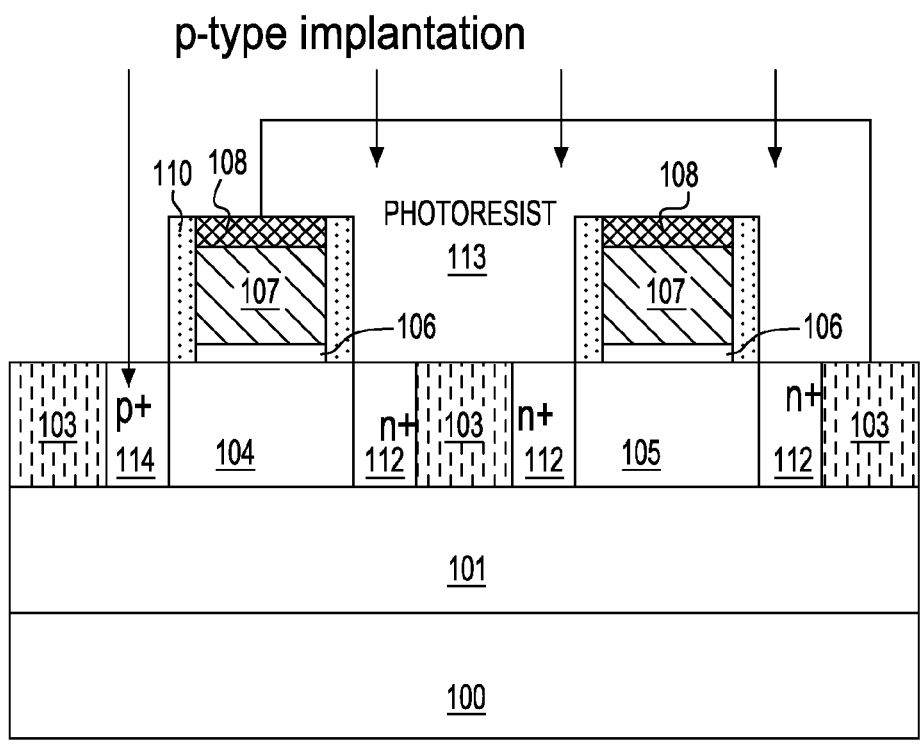
FIG. 13 shows a photoresist masking step with open areas which are to receive P+ doping by ion implantation, the P-dopant species preferably including boron. The P+ region serves as the P+ portion of the diode or the source drain region of the PFET (not shown).
Figure 14:
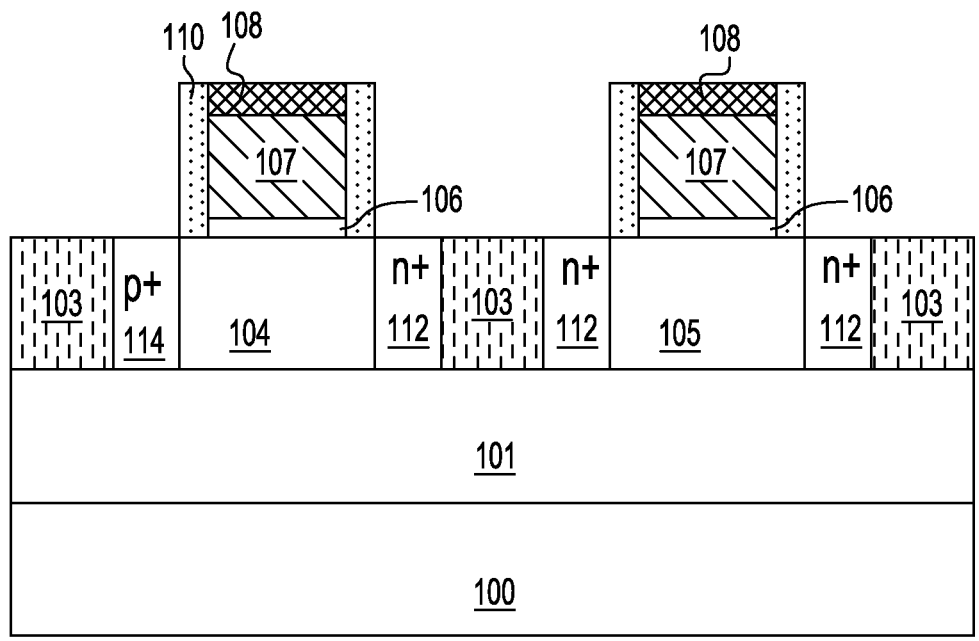
FIG. 14 is a perspective view of the structure following the removal of the photoresist.

FIG. 13 shows a photoresist masking step [113] that opens areas set to receive P+ doping by ion implantation [114]. P-dopant materials may include boron. The P+ region serves as the P+ portion of the diode or the source drain region of the PFET (not shown). The photoresist is then removed, resulting in the structure shown in FIG. 14. Alternatively, the P+ region can be formed by etching a trench and filling it with epitaxially deposited semiconductor, such as P-doped SiGe.

Figure 15:
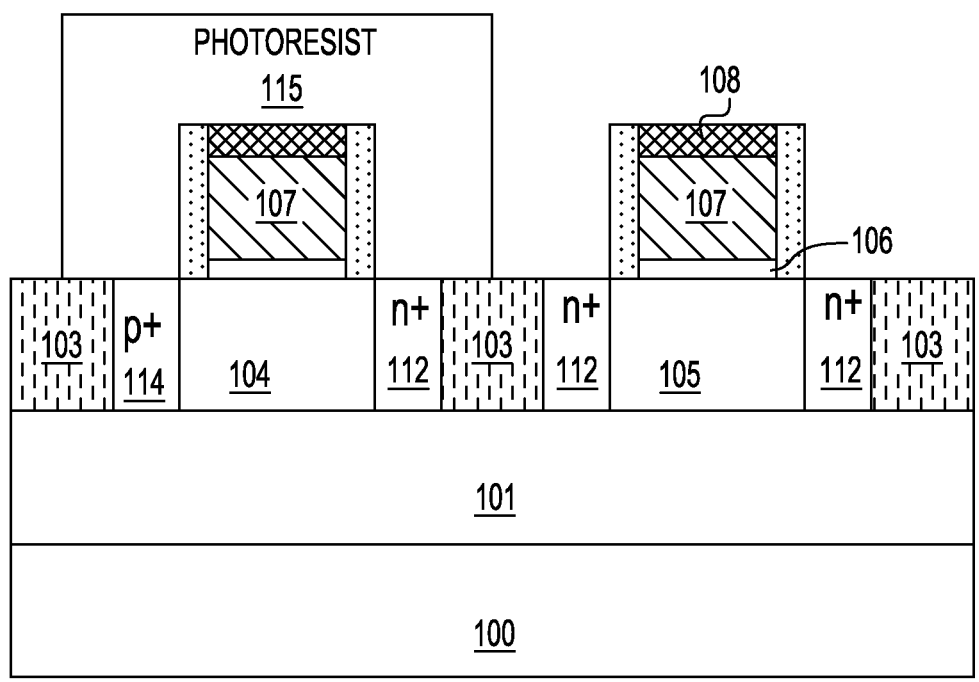
FIG. 15 shows a photoresist covering and protecting the diode while exposing the FET region to an etch that removes the hardmask over the gate of the FET.

FIG. 15 illustrates the photoresist step which covers and protects the diode, while exposing the FET region to etching that removes the hardmask [108] over the FET gate. The hardmask etch is preferably performed by RIE etching. The RIE etching can result in damaging the exposed regions as will be illustrated with reference to FIG. 16.

Figure 16:
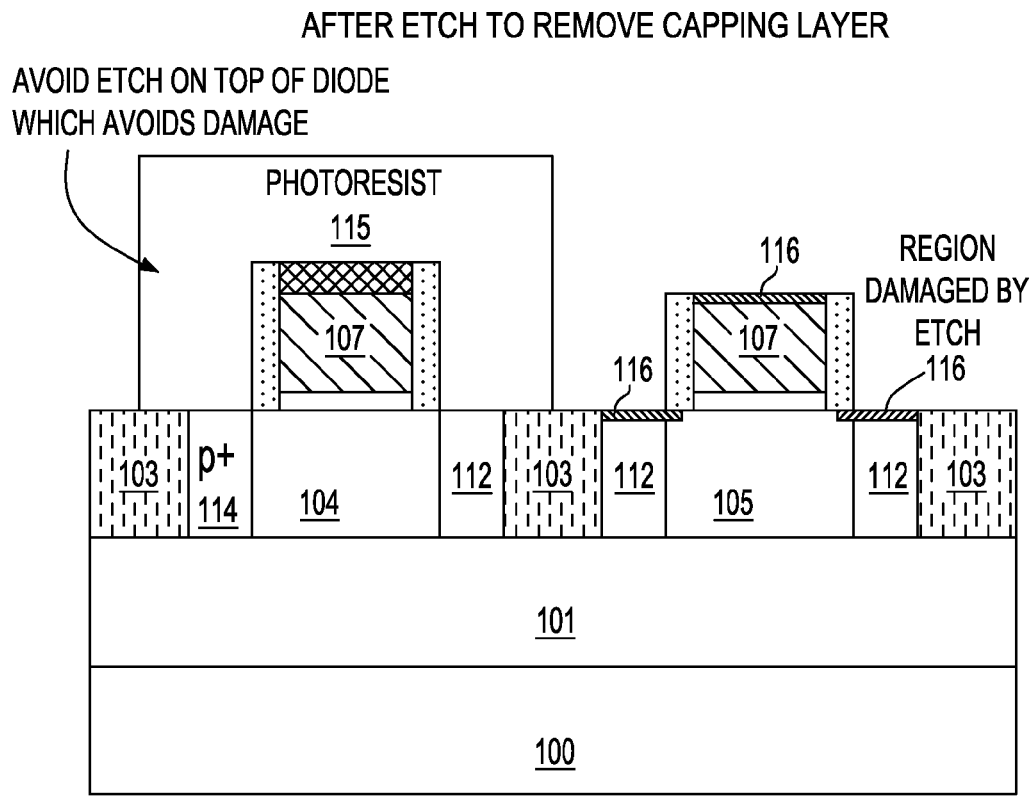
FIG. 16 illustrates the structure following RIE, highlighting resulting damaged regions, wherein the photoresist covers the diode region, leaving the diode protected from the hardmask RIE, thus preserving the diode.

Referring to FIG. 16, the structure is shown following RIE etching, illustrating the resulting damaged regions [116]. Because the photoresist [115] covers the diode region, it protects the diode from hardmask RIE damage, and preserves not only the diode, but it also avoids degradation of the diode ideality.

Figure 17:
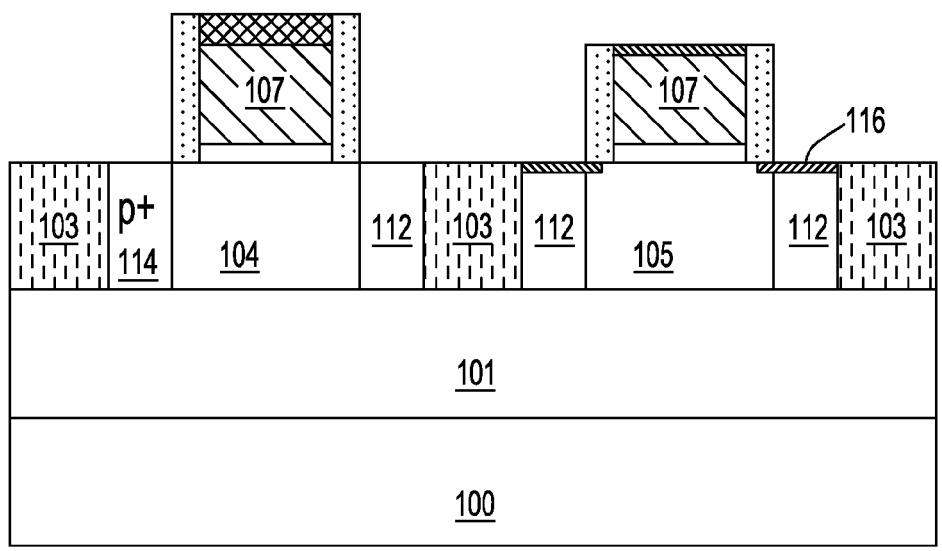
FIG. 17 shows the structure following the removal of the photoresist.

FIG. 17 shows the structure following the removal of the photoresist.

Figure 18:
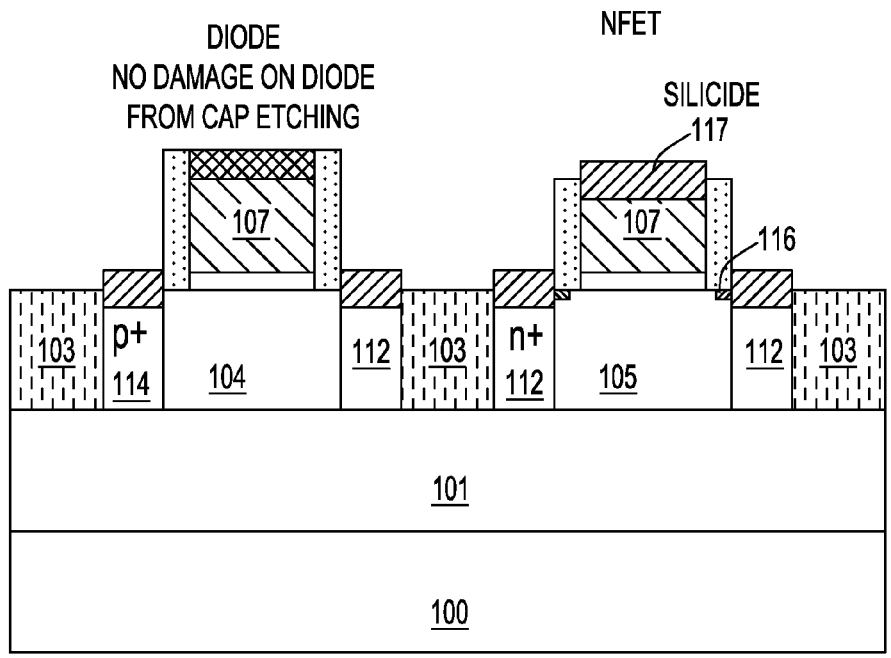
FIG. 18 depicts the structure after the formation of the silicide on the exposed N+ or P+ regions including the gate regions not covered by a spacer or by a hardmask, the diode gate remaining unsilicided while the hardmask is kept.

FIG. 18 shows a cross-section view of the structure after silicide [117] formation. The silicide can be selected from nickel silicide, titanium silicide, cobalt silicide, or any other silicide material. The nickel, titanium, cobalt or other similar metal is deposited on the entire structure. During at heating of the wafer, preferably by Rapid Thermal Annealing (RTA), the silicide forms as a reaction between the metal and the silicon on the exposed N+ or P+ regions including gate regions not covered by spacer [110] or the hardmask [108]. The FET gate is silicided leaving the diode gate unsilicided as a result of the hardmask still remaining in place. The unreacted metal on the spacer or the hardmask is etched away, preferably by aqueous chemistry.

Still referring to FIG. 18, in one embodiment, the gated-diode shown is devoid of any damage resulting from the absence of siliciding the gate, and is further formed alongside the FET having a silicided gate that allows it to achieve a high-performance caused by the reduced gate resistance.

Figure 19:
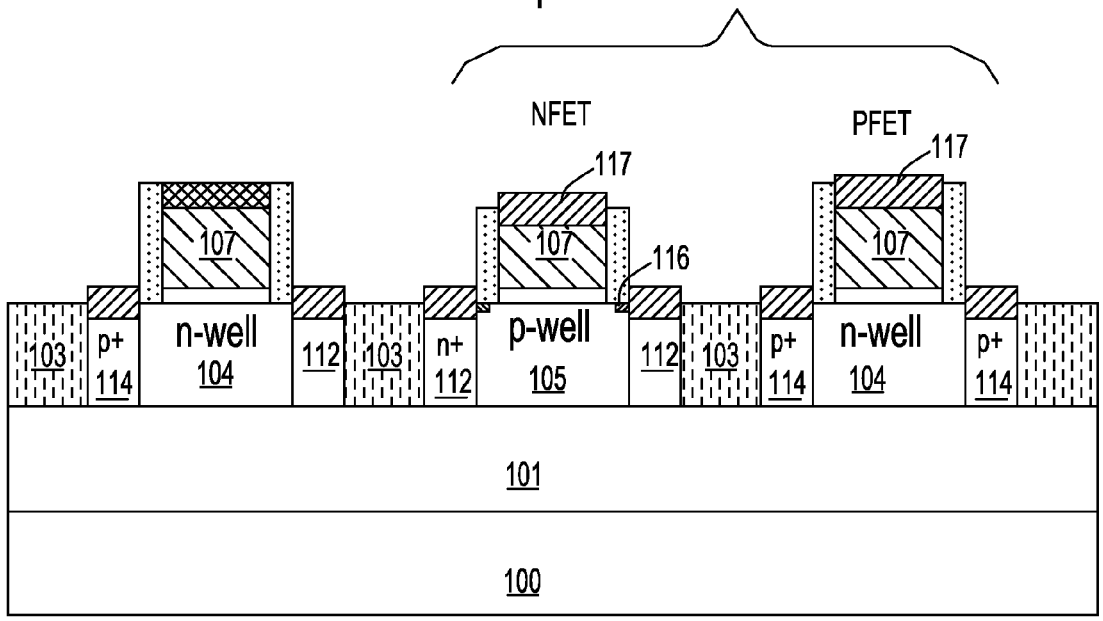
FIG. 19 shows a planar view of the structure shown in FIG. 18 including a gated-diode and a FET, in this example an NFET.

FIG. 19 shows an embodiment wherein the gated-diode with its non-silicided gate is formed alongside the NFET and PFET having a silicided gate. It should be noted that while the gated-diode is shown as a P+/N diode, an embodiment of the inventive structure could be equally applicable to a N+/P diode.

Figure 20:
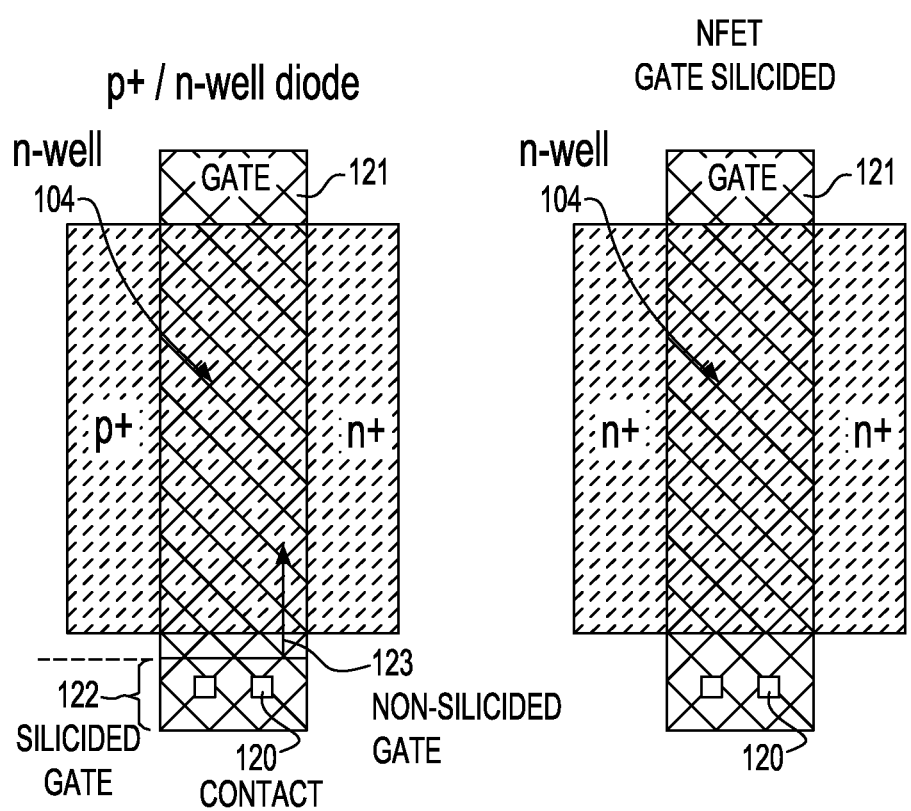
FIG. 20 shows an embodiment with a gated-diode with a non-silicided gate formed with NFETs and PFETs provided with silicided gates.

FIG. 20 shows a plan view of the structure illustrated in FIG. 18 depicting additional details of the structure. The non-silicided gate [123] of the gated-diode is shown in the region on top of the active region of the device, leaving the cap layer in place within the active region, thereby avoiding RIE damage to the active region of the diode. The gate [121] of the gated-diode is silicided outside the active region to the diode, over the STI, by removing the cap layer in the stated region that allows silicide to form. The silicide within the region enables a good contact between the contact [120] and the gate [121] of the gated-diode. Removing the cap layer in the region outside of the active area of the gated-diode does not create damage near the active region of the diode. Shown in FIG. 20, the gate of the FET is silicided [122].

Figure 21:
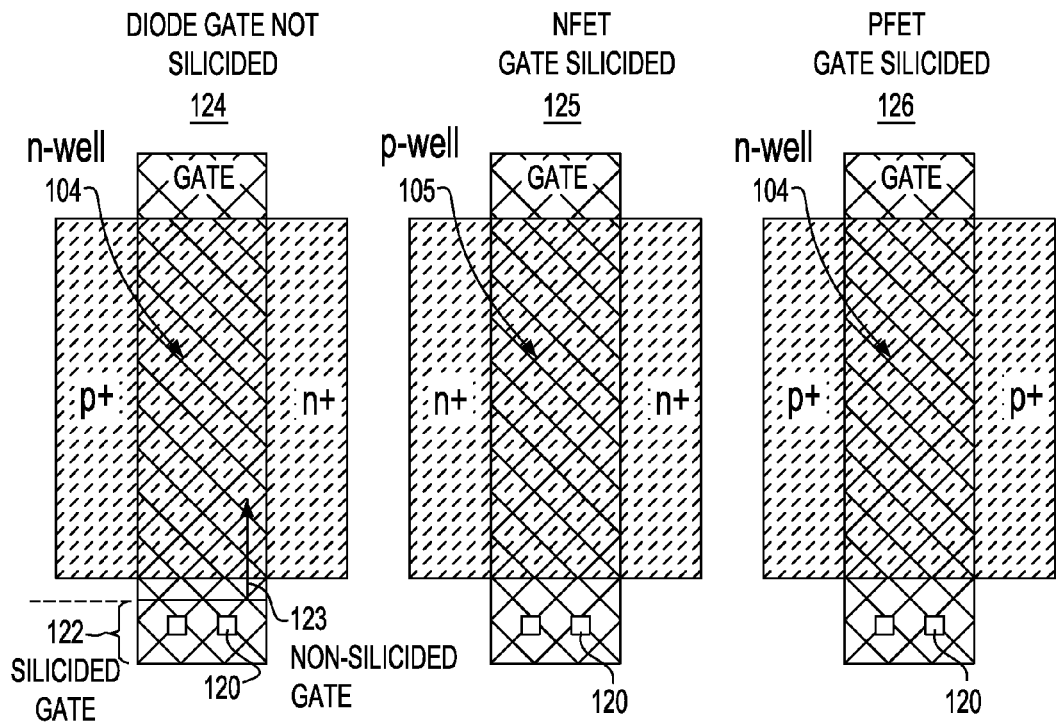
FIG. 21 illustrates a planar view of the structure shown in FIG. 20, including a gated-diode and a NFET and a PFET.

FIG. 21 shows a plan view of the structure from FIG. 19, illustrating an embodiment of the gated-diode with a non-silicided gate [124] and NFET [125] and PFET [126] with a silicided gate. The gate of the gated-diode is not silicided [124] in the region above the active region of the device, and leaving the cap layer in place within this region, making it possible to avoid RIE damage in the active region of the diode. The gate of the gated-diode is silicided outside the diode active region [122], over the STI, by removing the cap layer in this region, thus enabling silicide to be formed. The silicide in this region provides good contact between the contact [120] and the gate of the gated-diode. Removing the cap layer in the region outside of the active area of the gated-diode does not create damage near the active region of the diode. The gate of the FETs [125, 126] is silicided.

Figure 22:
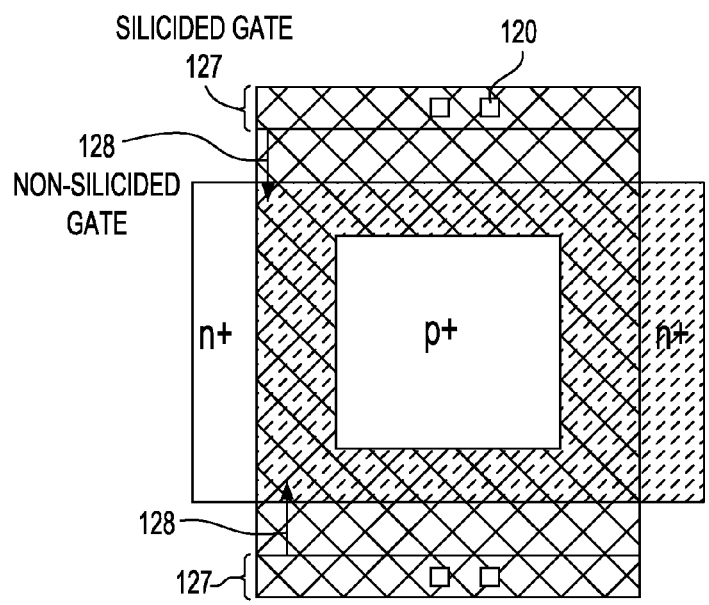
FIG. 22 shows a plan view of an embodiment of an alternate diode structure illustrating additional plan-view designs of gated-diode, in an embodiment showing the gated-diode formed within the perimeter of the gate.

FIG. 22 shows a plan view of an embodiment of an alternate diode structure illustrating other plan-view designs of the gated-diode (NFET and PFET not shown). In an embodiment, the diode is formed within the perimeter of the gate. As previously described, the gate of the gated-diode is not silicided [128] in the region located above the active region of the device by leaving the cap layer in place in this region, to avoid RIE damage within the active region of the diode. The gate of the gated-diode is silicided [127] in an area beyond the diode active region and spanning over the STI, and removing the cap layer from the region, thereby permitting the formation of silicide.

While the present disclosure has been particularly shown and described with respect to preferred embodiments thereof, it will be understood by those skilled in the art that the foregoing and other changes in forms and details can be made without departing from the spirit and scope of the present disclosure. In one therefore intended that the present disclosure not be limited to the exact forms and details described and illustrated, but fall within the scope of the appended claims.

What is claimed is:

1. A semiconductor structure on a substrate comprising:
   an FET having a silicided source, a silicided drain and a silicided gate stack, said silicided gate stack comprising a gate dielectric layer on top of said substrate, a semiconductor gate electrode on top of said gate dielectric, and a silicided layer on top of said semiconductor gate electrode; and
   a gated-diode adjacent to said FET having a silicide anode, a silicide cathode and a non-silicided gate stack, said non-silicided gate stack comprising a gate dielectric layer on top of said substrate, a gate electrode substantially made of semiconductor on top of said gate dielectric, said gate electrode having a top surface covered by a layer of material that inhibits said non-silicided gate stack to be silicided.

2. The structure as recited in claim 1 wherein a region surrounding the gated-diode is isolated from damage caused by RIE etching.

3. The structure as recited in claim 1, wherein said substrate is an SOI substrate, a bulk or a single crystal semiconductor.

4. The structure as recited in claim 3, comprising an n-well and a p-well above said substrate.

5. The structure as recited in claim 4, wherein said n-well and p-well are isolated by an STI.

6. The structure as recited in claim 4, wherein said gated-diode in one of the n-well or p-well, and said FET are respectively on said n-well or said p-well.

7. The structure as recited in claim 6 wherein said gate-diode stack comprises a gate dielectric, a gate electrode, and a hardmask.

8. The structure as recited in claim 6, wherein said gated-diode stack is terminated by a dielectric layer that inhibits silicide formation.

9. The structure as recited in claim 1, wherein said gate stack comprises a gate electrode made of semiconductor.

10. The structure as recited in claim 1 wherein said gate stack comprises a gate dielectric made of a high-K dielectric.

* * * * *